United States Patent
Chainer et al.

(10) Patent No.: US 9,370,122 B2
(45) Date of Patent: Jun. 14, 2016

(54) COOLING APPARATUS WITH A RESILIENT HEAT CONDUCTING MEMBER

(71) Applicant: International Business Machines Corporation, Armonk, NY (US)

(72) Inventors: Timothy J. Chainer, Putnam Valley, NY (US); Pritish R. Parida, Fishkill, NY (US); Mark D. Schultz, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 434 days.

(21) Appl. No.: 13/738,961

(22) Filed: Jan. 10, 2013

(65) Prior Publication Data

US 2014/0192476 A1      Jul. 10, 2014

(51) Int. Cl.
  *H05K 7/20*       (2006.01)
  *G06F 1/20*       (2006.01)
  *G06F 3/044*      (2006.01)

(52) U.S. Cl.
  CPC ............ *H05K 7/20009* (2013.01); *G06F 3/044* (2013.01); *H05K 7/20772* (2013.01); *G06F 2203/04108* (2013.01); *G06F 2203/04805* (2013.01)

(58) Field of Classification Search
  CPC ..................... H05K 7/20636; H05K 7/20772
  See application file for complete search history.

(56) References Cited

U.S. PATENT DOCUMENTS

| | | | |
|---|---|---|---|
| 6,453,987 B1 * | 9/2002 | Cheng | 165/80.3 |
| 6,731,501 B1 * | 5/2004 | Cheng | 361/679.47 |
| 7,221,569 B2 * | 5/2007 | Tsai | H01L 23/4093 257/719 |
| 7,264,041 B2 * | 9/2007 | Karidis et al. | 165/104.33 |
| 7,355,855 B2 * | 4/2008 | Karidis et al. | 361/710 |
| 7,362,582 B2 * | 4/2008 | Karidis et al. | 361/710 |
| 7,365,984 B2 * | 4/2008 | Jeong | 361/709 |
| 7,405,936 B1 * | 7/2008 | Campbell et al. | 361/699 |
| 7,408,780 B2 * | 8/2008 | Karidis et al. | 361/709 |
| 7,545,647 B2 * | 6/2009 | Karidis et al. | 361/710 |
| 7,545,648 B2 * | 6/2009 | Karidis et al. | 361/710 |
| 7,639,498 B2 * | 12/2009 | Campbell et al. | 361/699 |
| 7,663,883 B2 * | 2/2010 | Shirakami et al. | 361/700 |

(Continued)

FOREIGN PATENT DOCUMENTS

| | | | |
|---|---|---|---|
| JP | 363192256 A | | 8/1988 |
| JP | 401077199 A | | 3/1989 |

(Continued)

OTHER PUBLICATIONS

Laird Technologies, Tflex(TM) 700 Series Thermal Gap Filler, May 2010, 2 pages.*

(Continued)

*Primary Examiner* — Robert J Hoffberg
(74) *Attorney, Agent, or Firm* — Daniel P. Morris; Otterstedt, Ellenbogen & Kammer, LLP

(57) ABSTRACT

A cooling structure including a thermally conducting central element having a channel formed therein, the channel being configured for flow of cooling fluid there through, a first pressure plate, and a first thermally conductive resilient member disposed between the thermally conducting central element and the first pressure plate, wherein the first pressure plate, the first thermally conductive resilient member, and the thermally conducting central element form a first heat transfer path.

18 Claims, 4 Drawing Sheets

(56) References Cited

U.S. PATENT DOCUMENTS

| | | | |
|---|---|---|---|
| 7,907,398 B2 | 3/2011 | Hrehor, Jr. | |
| 7,916,485 B2 * | 3/2011 | Yu et al. | 361/710 |
| 7,965,509 B2 * | 6/2011 | Campbell et al. | 361/699 |
| 7,990,717 B2 * | 8/2011 | Zhu et al. | 361/710 |
| 8,004,846 B2 * | 8/2011 | Okada et al. | 361/721 |
| 8,027,162 B2 * | 9/2011 | Campbell et al. | 361/699 |
| 8,081,473 B2 * | 12/2011 | Cipolla et al. | 361/719 |
| 8,599,557 B2 * | 12/2013 | Peterson et al. | 361/699 |
| 8,659,897 B2 * | 2/2014 | Meijer et al. | 361/699 |
| 8,913,384 B2 * | 12/2014 | David et al. | 361/679.53 |
| 2006/0002087 A1 | 1/2006 | Bezama | |
| 2006/0250772 A1 | 11/2006 | Salmonson | |
| 2007/0146990 A1 * | 6/2007 | Hsieh | 361/690 |
| 2008/0116571 A1 | 5/2008 | Dang | |
| 2008/0123300 A1 | 5/2008 | Tian | |
| 2008/0174961 A1 | 7/2008 | Campbell | |
| 2008/0192428 A1 | 8/2008 | Clayton | |
| 2008/0259567 A1 | 10/2008 | Campbell | |
| 2008/0298016 A1 * | 12/2008 | Karidis et al. | 361/698 |
| 2009/0218087 A1 * | 9/2009 | Oshima | 165/185 |
| 2010/0006260 A1 * | 1/2010 | Oh et al. | 165/80.2 |
| 2010/0091447 A1 * | 4/2010 | Jaggers et al. | 361/679.47 |
| 2010/0157540 A1 * | 6/2010 | Yu et al. | 361/710 |
| 2010/0246136 A1 * | 9/2010 | Yu et al. | 361/710 |
| 2010/0294469 A1 * | 11/2010 | Chou | 165/121 |
| 2011/0069454 A1 | 3/2011 | Campbell | |
| 2013/0027870 A1 * | 1/2013 | Goldr an et al. | 361/679.32 |
| 2013/0342987 A1 * | 12/2013 | Yang et al. | 361/679.32 |
| 2015/0075000 A1 * | 3/2015 | Cox et al. | 29/890.03 |

FOREIGN PATENT DOCUMENTS

| | | | | |
|---|---|---|---|---|
| JP | 08-278099 A | * | 1/1996 | F42B 15/34 |
| JP | 2004079940 A | * | 3/2004 | H01L 23/40 |
| JP | 02010040886 A | | 2/2010 | |
| JP | 2013247257 A | * | 12/2013 | H01L 23/473 |
| WO | WO 2011110390 A1 | * | 9/2011 | H01L 23/473 |

OTHER PUBLICATIONS

Milnes P. David, "Experimental Characterization of an Energy Efficient Chiller-less Data Center Test Facility with Warm Water Cooled Servers", Semiconductor Thermal Measurement and Management Symposium (SEMI-THERM), 28th Annual IEEE pp. 232-237, Mar. 2012.

Madhusudan Iyengar , "Server liquid cooling with chiller-less data center design to enable significant energy savings", Semiconductor Thermal Measurement and Management Symposium (SEMI-THERM), 28th Annual IEEE pp. 212-223, Mar. 2012.

* cited by examiner

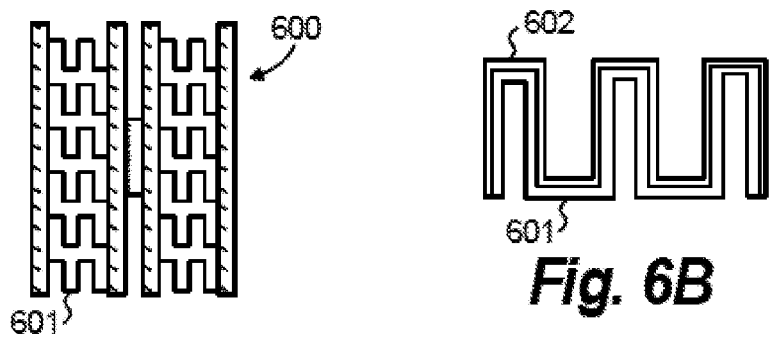
Fig. 6A
Fig. 6B
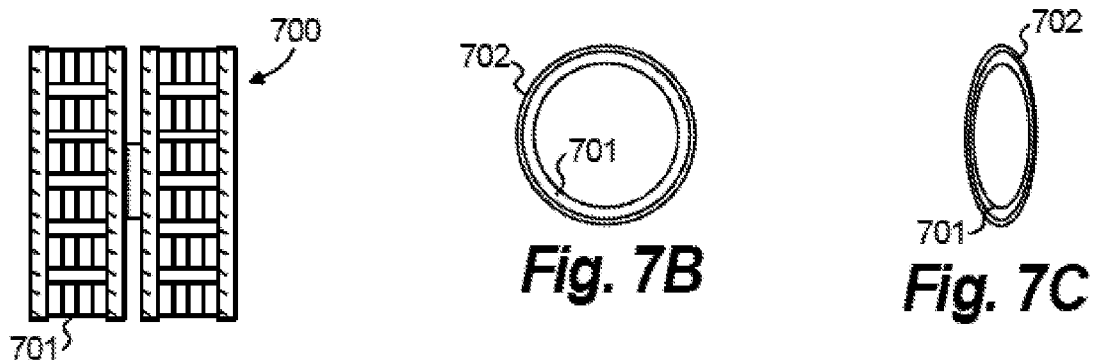
Fig. 7A
Fig. 7B
Fig. 7C
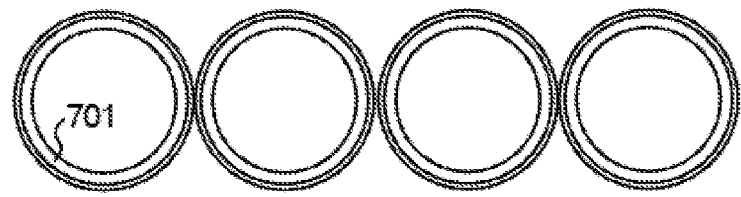
Fig. 7D
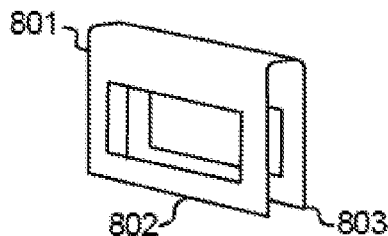
Fig. 8

COOLING APPARATUS WITH A RESILIENT HEAT CONDUCTING MEMBER

This invention was made with Government support under Contract No.: DE-EE0002894 (awarded by Department of Energy (DOE)). The Government has certain rights in this invention.

BACKGROUND

This disclosure relates to the thermodynamic arts, and more particularly, to cooling techniques for electronics and the like.

DIMM (Dual Inline Memory Module) cards include multiple chips attached on opposite sides of a printed circuit board. The DIMM cards can be inserted into sockets or connectors of a printed circuit board to establish a data connection to a computer system. The DIMM cards are typically cooled by air flow across the computer system.

BRIEF SUMMARY

According to an exemplary embodiment of the present disclosure, a cooling structure includes a thermally conducting central element having a channel formed therein, the channel being configured for flow of cooling fluid there through, a first pressure plate, and a first thermally conductive resilient member disposed between the thermally conducting central element and the first pressure plate, wherein the first pressure plate, the first thermally conductive resilient member, and the thermally conducting central element form a first heat transfer path.

According to an exemplary embodiment of the present disclosure, a computer memory system includes a substrate, a plurality of electronic modules connected to the substrate, wherein the plurality of electronic modules are disposed parallel relative to one another and vertically relative to the substrate, and a plurality of cooling structures, wherein each of the plurality of cooling structures is disposed between an adjacent pair of the plurality of electronic modules, each of the cooling structures includes a thermally conducting central element having a channel formed therein, the channel being configured for flow of cooling fluid there through, a first thermally conductive resilient member contacting the thermally conducting central element, a second thermally conductive resilient member contacting the thermally conducting central element, wherein the second thermally conductive resilient member is disposed opposite the first thermally conductive resilient member with respect to the thermally conducting central element, a first pressure plate contacting the first thermally conductive resilient member opposite the thermally conducting central element, wherein the first pressure plate, the first thermally conductive resilient member, and the thermally conducting central element form a first heat transfer path away from a first electronic module of the adjacent pair of the plurality of electronic modules, and a second pressure plate contacting the second thermally conductive resilient member opposite the thermally conducting central element, wherein the second pressure plate, the second thermally conductive resilient member, and the thermally conducting central element form a second heat transfer path away from a second electronic module of the adjacent pair of the plurality of electronic modules.

According to an exemplary embodiment of the present disclosure, a method of cooling an electronic module includes providing a cooling structure disposed in contact with said electronic module, providing a cooling fluid flowing through a channel, and cooling said electronic module by conducting heat of said electronic module through said cooling structure and to said cooling fluid flowing through said channel, wherein said cooling structure comprises a thermally conductive resilient member forming a heat transfer path between said electronic module and said cooling fluid flowing through said channel.

BRIEF DESCRIPTION OF THE SEVERAL VIEWS OF THE DRAWINGS

Preferred embodiments of the present disclosure will be described below in more detail, with reference to the accompanying drawings:

FIGS. 6A-B illustrate an alternate form of resilient member according to an embodiment of the present disclosure;

FIGS. 7A-D illustrate another alternate form of resilient member according to an embodiment of the present disclosure; and FIG. 8 is a diagram of a tie clip according to an embodiment of the present disclosure.

DETAILED DESCRIPTION

Disclosed is a cooling apparatus with a resilient heat conducting member. Embodiments of the present disclosure are applicable to systems including memory cards, and more particularly Dual Inline Memory Modules (DIMMs) and the like. It should be understood that embodiments of the present disclosure are not limited to the cooling of DIMMs in a computer system, and may be implemented with any pluggable component, such as video cards, rack mounted servers, etc., having a cooling or heating need, referred to more generally herein as electronic modules.

Embodiments of the present disclosure can be implemented in connection with a DIMM liquid cooling solution. A liquid cooling apparatus according to an embodiment of the present disclosure can be implemented with off-the-shelf DIMM, semi-custom DIMM, etc.

Figure 1:
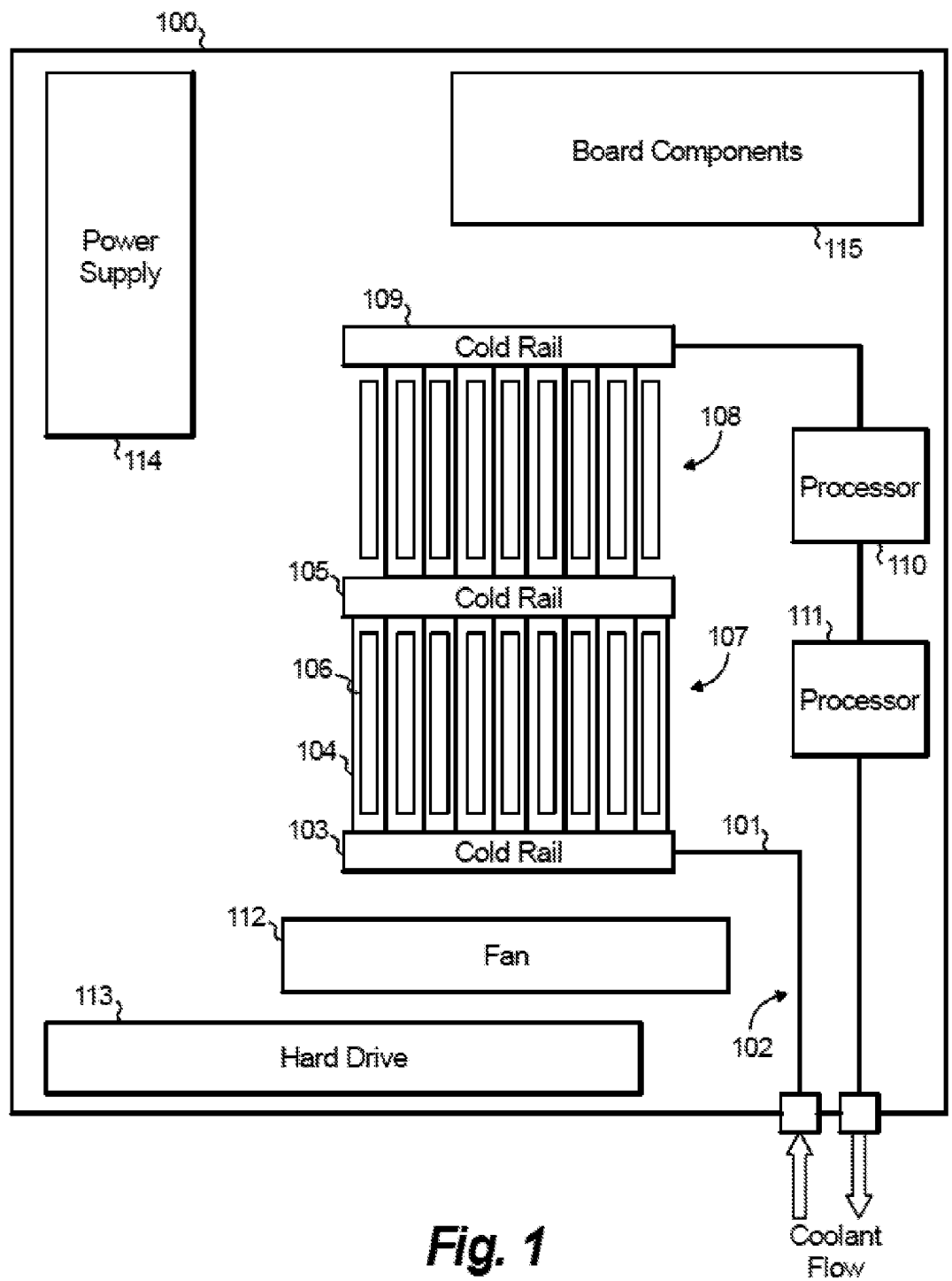
FIG. 1 is a block diagram depicting an exemplary hybrid air/liquid cooled computer system according to an embodiment of the present disclosure.

FIG. 1 illustrates a server system including a plurality of DIMM. More particularly, FIG. 1 is a block diagram of an exemplary liquid cooled server 100 including two processors and two blocks of memory modules. Within the liquid cooled server 100, a heat transfer assembly 101 includes a coolant flow path 102 (e.g., copper tubing). In the exemplary liquid cooled server 100, the coolant, e.g., water, ethylene glycol mixtures, etc., enters from a first side of the partially liquid cooled server, wherein the coolant flow path passes through a first coolant plenum 103 and is divided among a plurality of cooling tubes, e.g., 104. The coolant flow path can be recombined in a second coolant plenum 105. The cooling tubes extend between the first coolant plenum 103 and the second coolant plenum 105, wherein DIMMs, e.g., 106, are disposed adjacent to the cooling tubes. A first bank of DIMMs 107 is shown disposed between the first coolant plenum 103 and the second coolant plenum 105. A second bank of DIMMs 108 is shown disposed between the second coolant plenum 105 and a third coolant plenum 109. It should be understood that various configurations of the cooling tubes are possible. For example, for a number of DIMMs, n, there may be n+1 cooling tubes, as illustrated between the first coolant plenum 103 and the second coolant plenum 105. In an alternative embodiment, for a number of DIMMs, n, there may be n−1 cooling tubes, as illustrated between the second coolant plenum 105 and the third coolant plenum 109. In FIG. 1, after exiting the third coolant plenum 109, the coolant flow path pass through a cold plate structure of a first processor 110 and then through a cold plate structure of a second processor 111.

The liquid cooled server 100 may include various other components, such as one or more fans 112 providing additional cooling, one or more hard drives 113, a power supply module 114, and board components 115. One of ordinary skill in the art would appreciate that the present disclosure is not limited to the components described here and that these components are used only to illustrate an exemplary embodiments thereof.

Figure 2:
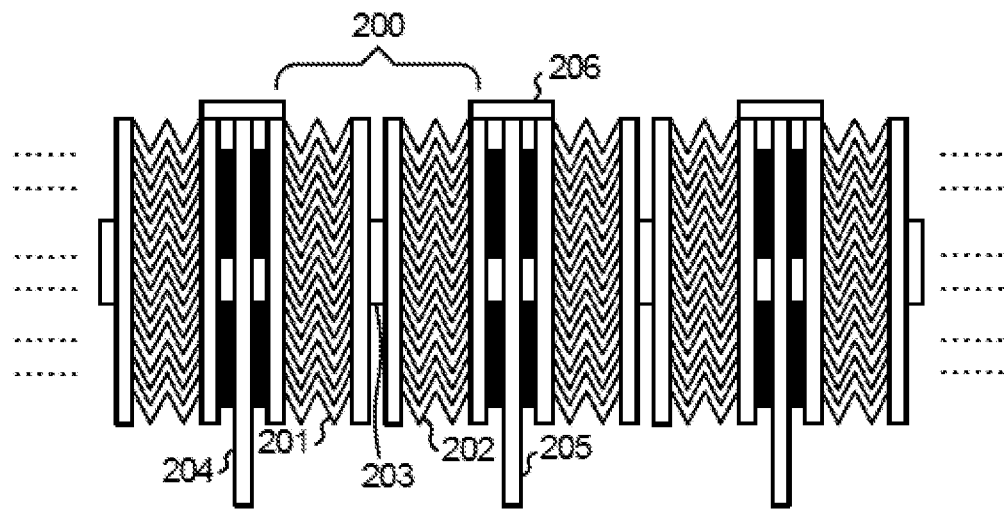
FIG. 2 is a diagram of a DIMM conduction sub-assembly (end view) according to an embodiment of the present disclosure.

FIG. 2 shows an exemplary embodiment of the present disclosure, in which a plurality of cooling structures, e.g., 200, each including at least one resilient member. For example, cooling structure 200 includes a first resilient member 201 and a second resilient member 202. Each cooling structure further includes one or more channels, e.g., 203, for carrying a liquid coolant (e.g., water). A tube (e.g., Aluminum or Copper), which may or may not be flattened, is a non-limiting example of a wall that defines a channel. The resilient members can be formed of a material such as Aluminum, Copper, Carbon, or the like. Each resilient member is disposed to transfer heat away from a respective DIMM. For example, the first and the second resilient member 201 and 202 transfer heat from DIMMs 204 and 205, respectively. Each tube carrying the coolant can be disposed in parallel and between adjacent DIMMs. Further, a plurality of tie clips, e.g., 206, can provide a mechanical connection between a cooling structure and an associated DIMM. Exemplary tie clips are further described below with reference to FIG. 5 and FIG. 8.

It should be understood that a cooling structure can include one or more resilient members.

Figure 3:
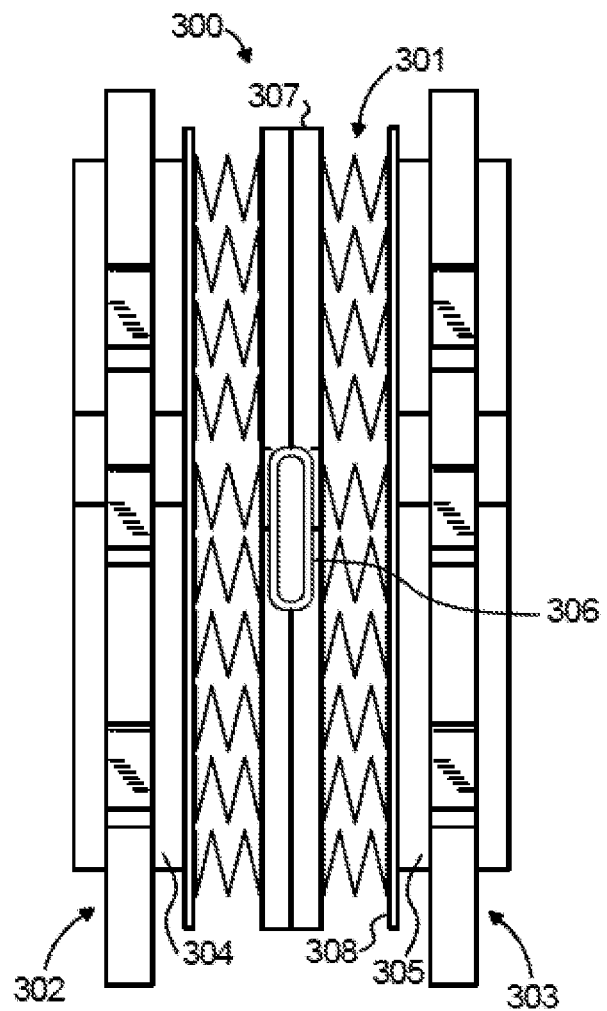
FIG. 3 is a diagram of a DIMM conduction sub-assembly (more detailed end view) according to an embodiment of the present disclosure.

Referring to FIG. 3, a liquid cooling structure 300 is disposed between a first DIMM 302 and a second DIMM 303. The liquid cooling structure 300 includes a resilient member 301 formed as a patterned metal (e.g., folded metal sheets). The resilient member 301 is compliant and applies a force toward the DIMM 303. In FIG. 3 the liquid cooling structure 300 is disposed to cool a first side 304 of DIMM 302 and a first side 305 of DIMM 303.

The resilient member 301 can be of the form of a zigzag pattern as shown in FIG. 3, a triangular wave, a square wave, stacked metal rings, and the like. The patterned metal structures can be made out of folded sheets, for example, having a thickness of about 100 microns.

Embodiments of the present disclosure are not limited to specific examples provided herein. One of ordinary skill in the art would appreciate that various resilient thermally conductive members, configured to apply an inward spring force can be implemented within the scope of the present disclosure. Further, the dimensions provided herein are non-limiting, and are provided only for the purpose of illustrating embodiments of the present disclosure.

Further, FIG. 3 shows a tube 306 of the liquid cooling structure 300 having a flattened cross-section. The liquid cooling structure 300 can be supported at least by the tube 306, which extends between a pair of coolant plenums, for example, as shown in FIG. 1. That is, the tubes, which are connected to coolant plenums, support the remaining components of the liquid cooling structure, including, the resilient member 301, etc.

The tube 306 can be round, oval, rectangular, etc. The tube 306 can be disposed in a conducting plate 307. The conducting plate 307 can be disposed between, and parallel to, the DIMMs 302 and 303. The tube 306 may be an integral component of the conducting plate 307, press fit into the conducting plate 307, connected by a solder, brazed, or the like. Further, the resilient member 301 is joined to opposite surfaces of the conducting plate 307, for example, by solder. Further, a pressure plate 308 is joined to the resilient member 301 opposite the conducting plate 307. The pressure plate 308 makes contact with the DIMM and establish a heat transfer path from the DIMM. Thermal grease, metal foil (e.g., Indium), thermal oil, or the like may be disposed between the pressure plates and the respective DIMM.

Further, an exemplary liquid cooling structure 300 can be formed as a unitary structure, wherein the pressure plate 308, the resilient member 301 and the conducting plate 307 are physically connected to one another, and the tube is disposed in the conducting plate 307. In another exemplary liquid cooling structure 300 can include the pressure plate 308, the resilient member 301 and the conducting plate 307 are physically connected to one another in a unitary structure, wherein the pressure plate 308 is physically connected to the DIMM. Here, the liquid cooling structure 300 can be connected to the DIMM; for example, the pressure plate 308 resilient member 301 and the conducting plate 307 can be a component of the DIMM, applying a pressure towards the tube 306, which can be formed as a separate component of the liquid cooling structure 300. In another exemplary embodiment, the pressure plate 308 can be physically connected to the DIMM and the conducting plate 307 can be physically connected to the tube 306, wherein the resilient member 301 is a separate component disposed between the pressure plate 308 and the conducting plate 307, held in place by a pressure applied towards the pressure plate 308 and the conducting plate 307. In other exemplary embodiments, the resilient member 301 can be physically connected to one of the pressure plate 308 and the conducting plate 307. It should be understood that exemplary embodiments described herein are not limiting, and that additional configurations of a liquid cooling structure 300 are contemplated by the present disclosure, for example, where the pressure plate 308 and/or the conducting plate 307 are formed of a plurality of independent sub-plates.

In view of FIG. 3, a pressure plate, a resilient member, a conducting plate and tube form a heat transfer path, wherein heat may be drawn from a component, such as a DIMM, and dissipated through the coolant and then to a heat exchanger or the like (not shown).

Figure 4:
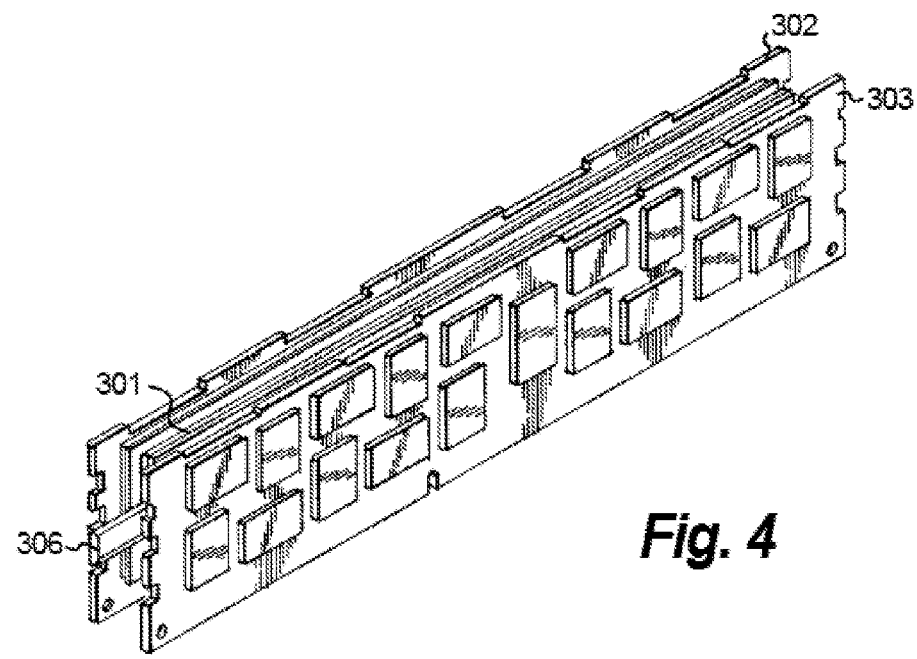
FIG. 4 is a diagram of a DIMM conduction sub-assembly (perspective view) according to an embodiment of the present disclosure.

FIG. 4 is a perspective view of the liquid cooling structure 300 including a resilient member 301 and tube 306, and DIMMs 302 and 303 of FIG. 3.

Figure 5:
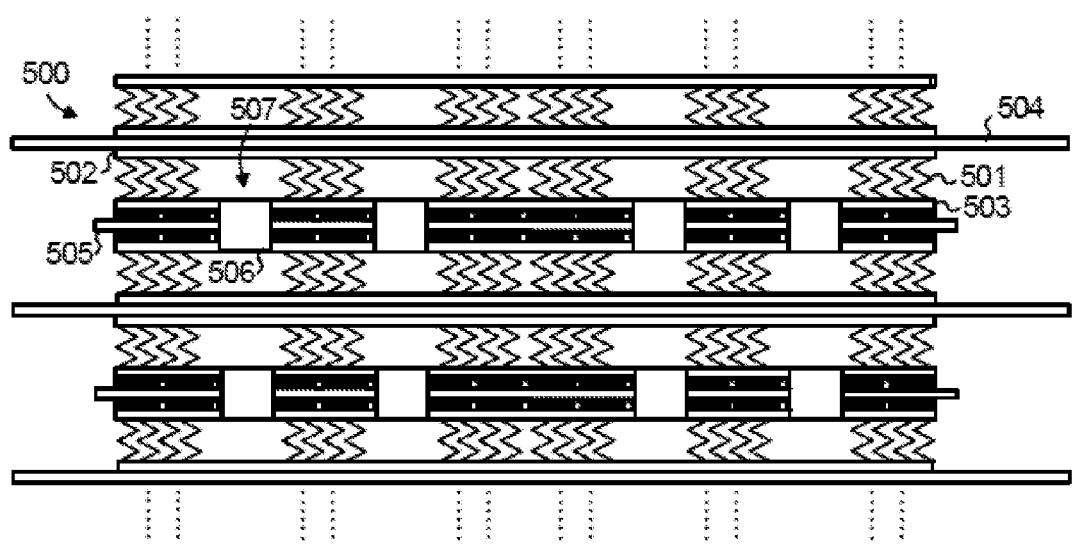
FIG. 5 is a diagram of a DIMM conduction sub-assembly (top view) according to an embodiment of the present disclosure.

FIG. 5 illustrates an exemplary embodiment wherein a liquid cooling structure 500 includes a plurality of distinct resilient members, e.g., 501, formed between a conducting plate 502 and a pressure plate 503. The liquid cooling structure 500 further includes a tube 504 in which a coolant can flow to absorb heat from the DIMM 505. FIG. 5 further illustrates a plurality of tie clips, e.g., 506, providing a mechanical connection between the pressure plates and the DIMM. A tie clip can be disposed in space, e.g., 507, between adjacent resilient members.

FIG. 6A shows an exemplary embodiment of a liquid cooling structure 600 including resilient members 601 formed as a square wave. In an exemplary implementation, the resilient members 601 can be formed of a copper material having a thickness of about 0.1 millimeters, a wave height of about 5 millimeters and a wave width of about 0.5 millimeters. It should be understood that any exemplary dimensions provided herein are non-limiting and that variations in the dimensions are possible within the scope of the present disclosure. In another alternative, an elastomeric material 602 can be applied to one or more sides of the material forming the resilient members 601, as show in FIG. 6B. It should be understood that the elastomeric material 602 can be applied to any shaped resilient member and is not limited to the square wave. According to an embodiment of the present disclosure, the elastomeric material can be added to achieve a desired compliance in the resilient members 601.

FIG. 7A shows an end view of an exemplary embodiment of a liquid cooling structure 700 including resilient members 701 formed of stacked hollow ring patterns. In an exemplary implementation, the resilient members 701 can be formed of a copper material having a thickness of about 0.1 millimeters and a ring diameter of about 1 millimeter. It should be understood that any exemplary dimensions provided herein are non-limiting and that variations in the dimensions are possible within the scope of the present disclosure. FIGS. 7B-C show top views of a hollow ring pattern including a resilient member 701 and an elastomeric material 702, wherein FIG. 7C is a compressed structure as may occurred when a DIMM is disposed adjacent to the liquid cooling structure 700. In a non-limited example, the elastomeric material 702 can have a thickness of about 0.2 millimeters. FIG. 7D shows a stacked structure including a plurality of the resilient members 701. It should be understood that while the axes of the resilient members are shown as being substantially parallel to a long dimension of the DIMM, that the resilient members can be disposed in other orientations, e.g., having axes substantially parallel to a short dimension of the DIMM.

Referring now to FIG. 8, an exemplary tie clip 801 can be formed of a spring steel, or the like, to secure a liquid cooling structure to a DIMM. The tie clip 801 can have any shape configured to perform a securing function and is not limited to the form shown in the figure. As shown in FIG. 5, the tie clip can be configured to receive a DIMM and respective pressure plates of two cooling structures disposed on opposite sides of the DIMM. The tie clip 801 can secure the respective pressure plates to the DIMM, for example, under a spring tension created by spreading extending portions 802 and 803. Thus, the design of exemplary tie clip 801 is a non-limiting example of a specific tie clip useful at 206 in FIG. 2 and/or 506 in FIG. 5.

Embodiments of the present disclosure can achieve improved heat transfer away from the DIMMs, for example, achieving a temperature difference between the DIMM and coolant of about 11 degrees Celsius. Further, the pressure drop is expected to be much less than one pound per square inch (psi). Moreover, the spring tension of certain exemplary embodiments enables installation, removal and replacement of DIMM without the use of additional mechanical devices (e.g., bolts, screws, etc.) securing the DIMM to a DIMM slot of the server system, a mother board, etc. Such field-replaceability is believed to be a significant benefit of one or more embodiments.

By way of recapitulation, according to an exemplary embodiment of the present disclosure, a cooling structure can include a thermally conducting central element having a channel formed therein, the channel being configured for flow of cooling fluid there through, a first pressure plate, and a first thermally conductive resilient member disposed between the thermally conducting central element and the first pressure plate, wherein the first pressure plate, the first thermally conductive resilient member, and the thermally conducting central element form a first heat transfer path. Further, according to an exemplary embodiment of the present disclosure, a computer memory system can include a substrate, a plurality of electronic modules connected to said substrate, wherein said plurality of electronic modules are disposed parallel relative to one another and vertically relative to said substrate, and a plurality of cooling structures, wherein each of said plurality of cooling structures is disposed between an adjacent pair of said plurality of electronic modules.

Although illustrative embodiments of the present disclosure have been described herein with reference to the accompanying drawings, it is to be understood that the disclosure is not limited to those precise embodiments, and that various other changes and modifications may be made therein by one skilled in the art without departing from the scope of the appended claims.

What is claimed is:

1. A cooling structure comprising:
   a thermally conducting central element having a channel formed therein, said channel being configured to pass a flow of cooling fluid there through;
   a first pressure plate;
   a first thermally conductive resilient member disposed between said thermally conducting central element and said first pressure plate, wherein said first pressure plate, said first thermally conductive resilient member, and said thermally conducting central element form a first heat transfer path, and wherein said first thermally conductive resilient member is joined to each of said thermally conducting central element and said first pressure plate forming a unitary structure; and
   an elastomeric material layer applied to a side of said first thermally conductive resilient member, said side extending from said first pressure plate to said thermally conducting central element.

2. The cooling structure of claim 1, further comprising:
   a second pressure plate; and
   a second thermally conductive resilient member disposed between said thermally conducting central element and said second pressure plate, wherein said second thermally conductive resilient member is disposed opposite said first thermally conductive resilient member with respect to said thermally conducting central element, and wherein said second pressure plate, said second thermally conductive resilient member, and said thermally conducting central element form a second heat transfer path.

3. The cooling structure of claim 1, wherein said first thermally conductive resilient member is formed by a folded metal sheet.

4. The cooling structure of claim 1, wherein said first thermally conductive resilient member applies a force creating contact between said first pressure plate and an external heat source.

5. The cooling structure of claim 1, wherein said first thermally conductive resilient member applies a force creating contact between said thermally conducting central element and said channel.

6. The cooling structure of claim 1, wherein said first thermally conductive resilient member applies a force sufficient to maintain a disposition between said first pressure plate and said thermally conducting central element, wherein said first pressure plate is physically connected to an external heat source.

7. The cooling structure of claim 1, wherein said first thermally conductive resilient member is formed by a stack of metal rings.

8. A computer memory system comprising:
a substrate;
a plurality of electronic modules connected to said substrate, wherein said plurality of electronic modules are disposed parallel relative to one another and perpendicular relative to said substrate; and
a plurality of cooling structures, wherein each of said plurality of cooling structures is disposed between an adjacent pair of said plurality of electronic modules, each of said cooling structures comprising:
  a thermally conducting central element having a channel formed therein, said channel being configured to pass a flow of cooling fluid there through;
  a first thermally conductive resilient member contacting said thermally conducting central element;
  a second thermally conductive resilient member contacting said thermally conducting central element, wherein said second thermally conductive resilient member is disposed opposite said first thermally conductive resilient member with respect to said thermally conducting central element;
  a first pressure plate contacting said first thermally conductive resilient member opposite said thermally conducting central element, wherein said first pressure plate, said first thermally conductive resilient member, and said thermally conducting central element form a first heat transfer path away from a first electronic module of said adjacent pair of said plurality of electronic modules;
  a second pressure plate contacting said second thermally conductive resilient member opposite said thermally conducting central element, wherein said second pressure plate, said second thermally conductive resilient member, and said thermally conducting central element form a second heat transfer path away from a second electronic module of said adjacent pair of said plurality of electronic modules; and
  an elastomeric material layer applied to a side of each of said first thermally conductive resilient member and said second thermally conductive resilient member, said sides extending from respective ones of said first and second pressure plates to said thermally conducting central element.

9. The computer memory system of claim 8, further comprising a pair of coolant plenums, wherein said plurality of cooling structures are connected between said pair of coolant plenums.

10. The computer memory system of claim 9, wherein a first coolant plenum of said pair of coolant plenums provides said cooling fluid to said plurality of cooling structures and a second coolant plenum of said pair of coolant plenums receives said cooling fluid from said plurality of cooling structures.

11. The computer memory system of claim 8, wherein said first thermally conductive resilient member applies a force creating contact between said first pressure plate and said first electronic module.

12. The computer memory system of claim 8, wherein said second thermally conductive resilient member applies a force creating contact between said second pressure plate and said second electronic module.

13. The computer memory system of claim 8, wherein said first thermally conductive resilient member and said second thermally conductive resilient member each comprise a respective folded metal sheet.

14. The computer memory system of claim 8, wherein said first thermally conductive resilient member and said second thermally conductive resilient member each comprise a respective stack of metal rings.

15. The computer memory system of claim 8, wherein each of said plurality of electronic modules is a Dual Inline Memory Module card.

16. A method of cooling an electronic module comprising:
providing a cooling structure disposed in contact with said electronic module;
providing a cooling fluid flowing through a channel; and
cooling said electronic module by conducting heat of said electronic module through said cooling structure to said cooling fluid flowing through said channel, wherein said cooling further comprises conducting said heat through a unitary structure of said cooling structure comprising a thermally conductive resilient member disposed between a thermally conducting central element and a pressure plate contacting said electronic module and, said unitary structure forming a heat transfer path between said electronic module and said cooling fluid flowing through said channel,
wherein said thermally conductive resilient member comprises an elastomeric material layer affecting a compliance of said thermally conductive resilient member in a direction parallel to said heat transfer path.

17. The method of claim 16, wherein said thermally conductive resilient member comprises a folded metal sheet conducting said heat of said electronic module.

18. The method of claim 16, wherein said thermally conductive resilient member comprises a stack of metal rings conducting said heat of said electronic module.

* * * * *